US012777854B2

(12) United States Patent
Chiang

(10) Patent No.: US 12,777,854 B2
(45) Date of Patent: Oct. 27, 2026

(54) METHOD OF MANUFACTURING SEMICONDUCTOR DEVICE

(71) Applicant: NANYA TECHNOLOGY CORPORATION, New Taipei city (TW)

(72) Inventor: Yubon Chiang, Kaohsiung City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 499 days.

(21) Appl. No.: 18/484,742

(22) Filed: Oct. 11, 2023

(65) Prior Publication Data

US 2025/0125144 A1 Apr. 17, 2025

(51) Int. Cl.

*H10P 14/60* (2026.01)
*H10D 62/10* (2025.01)
*H10P 14/20* (2026.01)
*H10P 14/694* (2026.01)
*H10W 20/00* (2026.01)

(52) U.S. Cl.

CPC ....... *H10P 14/6328* (2026.01); *H10D 62/115* (2025.01); *H10P 14/3416* (2026.01); *H10P 14/69433* (2026.01); *H10W 20/098* (2026.01)

(58) Field of Classification Search

CPC ...... H10D 62/115–116; H10P 14/6943–69433
See application file for complete search history.

(56) References Cited

U.S. PATENT DOCUMENTS 11,437,384 B1 * 9/2022 Wang .................. H10B 12/485

* cited by examiner

*Primary Examiner* — Amar Movva
(74) *Attorney, Agent, or Firm* — CKC & Partners Co., LLC

(57) ABSTRACT

A method of manufacturing a semiconductor device includes providing a bit line structure on a substrate, and the bit line structure is located between a pair of spacers containing air gaps. The method further includes depositing a silicon nitride film to seal the air gaps. Depositing the silicon nitride film includes providing gases from a showerhead into a process chamber. The showerhead and a wafer on a carrier have a first distance therebetween.

Depositing the silicon nitride film further includes purging the process chamber, and lifting up the showerhead such that the first distance is increased to a second distance greater than the first distance.

16 Claims, 9 Drawing Sheets

METHOD OF MANUFACTURING SEMICONDUCTOR DEVICE

BACKGROUND

Field of Invention

The present invention relates to a method of manufacturing a semiconductor device, especially for a semiconductor device having air gaps.

Description of Related Art

Semiconductor devices are widely used in electronics industries. A semiconductor device with a bit line structure sandwiched by a pair of air gaps is commonly used for reducing current leakage. However, thickness conformity of the film used to seal the air gaps is crucial for preventing the material above the bit line structures from filling into the air gaps.

Accordingly, it is still a development direction for the industry to provide a method of forming a semiconductor device which can improve the capability to protect the air gaps.

SUMMARY

One aspect of the present disclosure provides a method of manufacturing a semiconductor device.

In one embodiment, the method of manufacturing a semiconductor device includes providing a bit line structure on a substrate, and the bit line structure is located between a pair of spacers containing air gaps. The method further includes depositing a silicon nitride film to seal the air gaps. Depositing the silicon nitride film includes providing gases from a showerhead into a process chamber. The showerhead and a wafer on a carrier have a first distance therebetween. Depositing the silicon nitride film further includes purging the process chamber, and lifting up the showerhead such that the first distance is increased to a second distance greater than the first distance.

In one embodiment, a pressure in the process chamber is in a range from 4.5 torr to 5 torr before the step of purging the process chamber.

In one embodiment, the pressure in the process chamber is reduced to smaller than the 4.5 torr in the step of lifting up the showerhead.

In one embodiment, the gases include helium and nitrogen, and a ratio between helium and nitrogen is 1:6.

In one embodiment, the step of depositing the silicon nitride film to seal the air gaps further includes pumping the gases out of the process chamber after lifting up the showerhead.

In one embodiment, the step of lifting up the showerhead is performed when the gases include helium and nitride.

In one embodiment, the method further includes depositing a first nitride layer on the silicon nitride film.

In one embodiment, the method further includes removing a portion of the silicon nitride film and a portion of the first nitride layer to expose a landing pad disposed over the bit line structure.

In one embodiment, the method further includes forming a cell contact in a second nitride layer above the landing pad.

Another aspect of the present disclosure provides a method of manufacturing a semiconductor device.

In one embodiment, the step of increasing the first distance is performed by lifting up the showerhead away from the carrier.

In one embodiment, a pressure in the process chamber is in a range from 4.5 torr to 5 torr before the step of purging the process chamber.

In one embodiment, the pressure in the process chamber is reduced to smaller than the 4.5 torr in the step of increasing the first distance between the showerhead and the wafer.

In one embodiment, the gases include helium and nitrogen, and a ratio between helium and nitrogen is 1:6.

In one embodiment, the step of depositing the silicon nitride film to seal the air gaps further includes pumping the gases out of the process chamber after increasing the first distance between the showerhead and the wafer.

In one embodiment, the step of increasing the first distance between the showerhead and the wafer is performed when the gases include helium and nitride.

In one embodiment, the method of manufacturing a semiconductor device includes providing a bit line structure on a substrate, and the bit line structure is located between a pair of spacers containing air gaps. The method further includes depositing a silicon nitride film to seal the air gaps. The method further includes depositing a silicon nitride film to seal the air gaps. Depositing the silicon nitride film includes providing gases from a showerhead into a process chamber. The showerhead and a wafer on a carrier have a first distance therebetween. Depositing the silicon nitride film further includes purging the process chamber, and increasing the first distance between the showerhead and the wafer to a second distance greater than the first distance.

In the aforementioned embodiments, the method of forming the silicon nitride layer to seal the air gaps of the present disclosure can improve thickness conformity. As such, the nitride layer formed above the silicon nitride layer won't fill into the air gaps. Therefore, the method can prevent abnormal profile between the cell contacts 180 and the landing pads 150 and prevent wafer acceptance test failure.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
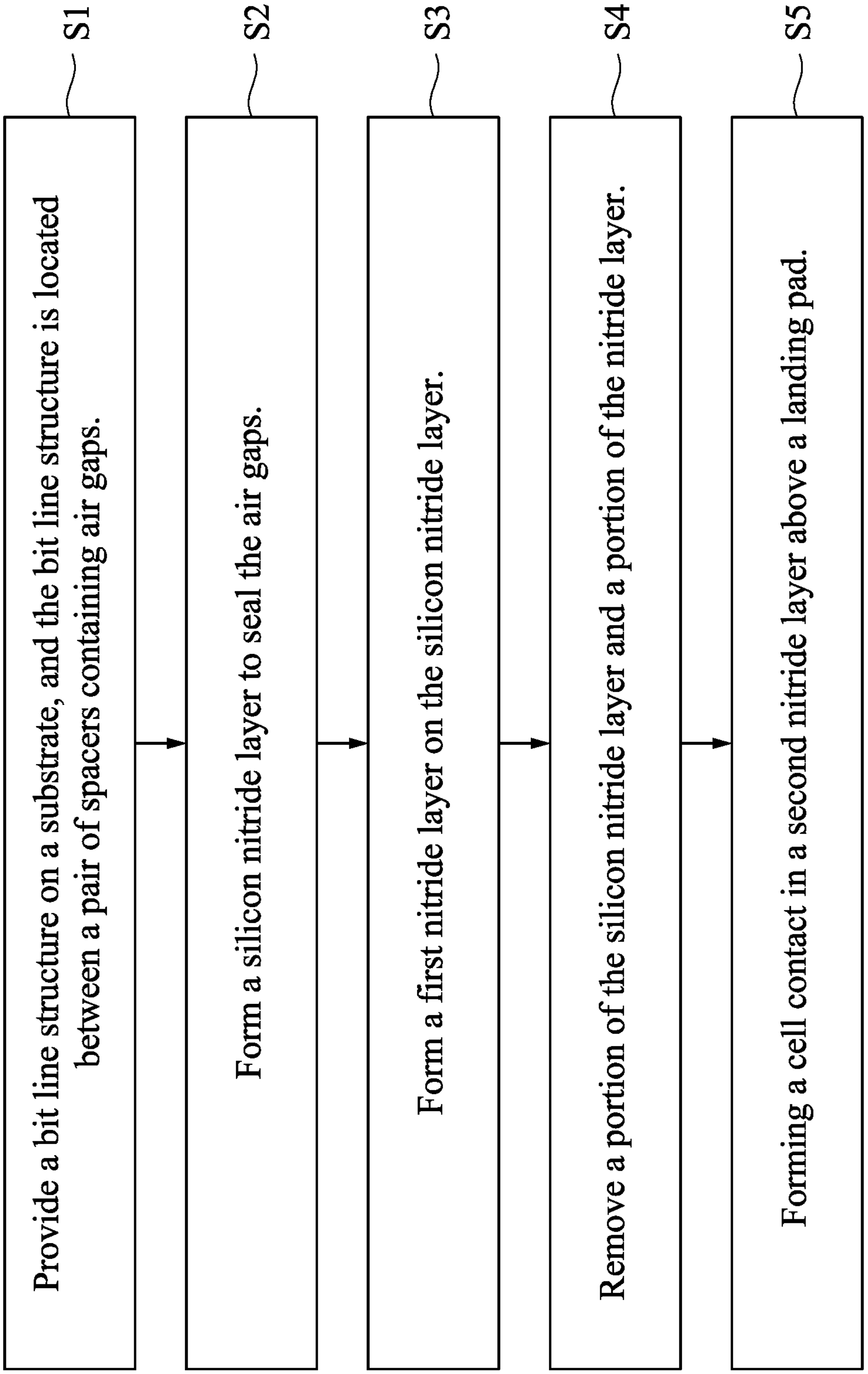
FIG. 1 is a flow chart of a method of manufacturing a semiconductor device.

Reference will now be made in detail to the present embodiments of the invention, examples of which are illustrated in the accompanying drawings. Wherever possible, the same reference numbers are used in the drawings and the description to refer to the same or like parts.

FIG. 1 is a flow chart of a method of manufacturing a semiconductor device 100. The method starts at step S1, a bit line structure on a substrate is provided, and the bit line structure is located between a pair of spacers containing air gap. Thereafter, in step S2, a silicon nitride layer is formed to seal the air gaps. Next, in step S3, a first nitride layer is formed on the silicon nitride layer. Subsequently, in step S4, a portion of the silicon nitride layer and a portion of the first nitride layer are removed. Lastly, in step S5, a cell contact is formed in a second nitride layer above a landing pad.

Figure 2:
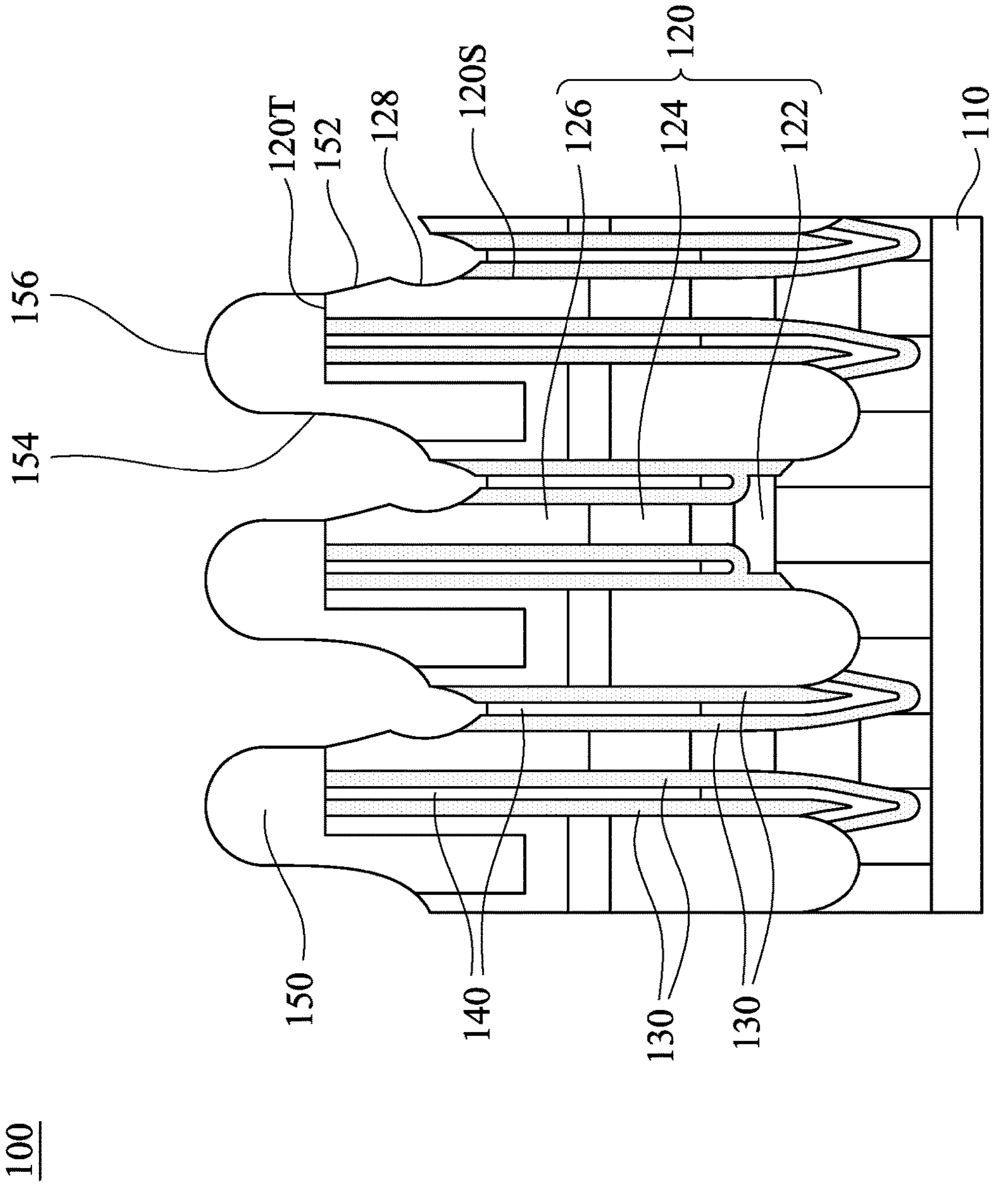
FIG. 2 to FIG. 6 are cross sectional views of the semiconductor device at various stages of the method in FIG. 1.

FIG. 2 to FIG. 6 are cross sectional views of the semiconductor device at various stages of the method in FIG. 1. Reference is made to FIG. 1 and FIG. 2. In step S1, a substrate 110 including bit line structures 120 thereon is provided. The bit line structures 120 are sandwiched by a pair of spacers 130, and each one of the spacers 130 includes an air gap 140. The term "air gap" is used to denote a cavity which may be filled with air, with a gas other than air, or in particular with an inert gas such as argon, or which may otherwise be a vacuum. Landing pads 150 are disposed over the bit line structures 120. In some embodiments, for example, a process such as atomic layer deposition (ALD), atomic layer epitaxy (ALE), atomic layer chemical vapor deposition (ALCVD), spin-coating, sputtering or the like can be used to form the landing pad 150 above the bit line structures 120.

In some embodiments, the bit line structure 120 sequentially includes a bit line contact 122 disposed on the surface of the substrate 110, a tungsten layer 124 disposed on the bit line contact 122, and a nitride layer 126 disposed on the tungsten layer 124, but the present discloser is not limited thereto.

Each of the bit line structures 120 has a top surface 120T away from the substrate 110 and sidewalls 120S connecting the top surface 120T. Landing pads 150 are disposed on the top surfaces 120T of the bit line structures 120 and on the spacers 130.

An upper portion of the bit line structures 120 and an upper portion of the spacers 130 are removed. Therefore, each of the bit line structures 120 has a recessed surface 128 connecting the top surface 120T and the sidewalls 120S.

Each of the landing pads 150 has a first surface 152 connecting the recessed surface 128 of the bit line structures 120. Each of the landing pads 150 also has a second surface 154 facing the recessed surface 128 and a top surface 156 connecting the first surface 152 and the second surface 154.

In some embodiments, the recessed surface 128 of the bit line structures 120 is formed when the material in the cavity (air gaps 140) are removed. For example, the material initially in the cavity (such as oxide layer) is removed through an anisotropic dry etch process or a post reactive ion etching (RIE) process.

The substrate 110 may be a semiconductor substrate, a base semiconductor layer on a supporting structure, a metal electrode, or a semiconductor substrate having one or more layers, structures or regions formed thereon. The substrate may be a semiconductor wafer such as a silicon wafer. Alternatively, the substrate may include elementary semiconductor materials, compound semiconductor materials, and/or alloy semiconductor materials.

Examples of the alloy semiconductor materials may include, but are not limited to, SiGe, GaAsP, AlInAs, AlGaAs, GaInAs, GaInP and/or GaInAsP. In some embodiments, the substrate may be a silicon substrate, a gallium arsenide substrate, a silicon germanium substrate, a ceramic substrate, a quartz substrate, a glass substrate, a silicon-on-insulator (SOI) substrate, or the like. In some embodiments, the substrate is a multi-layer structure including a polysilicon layer and a metal layer stacked on the substrate in sequence.

Figure 3:
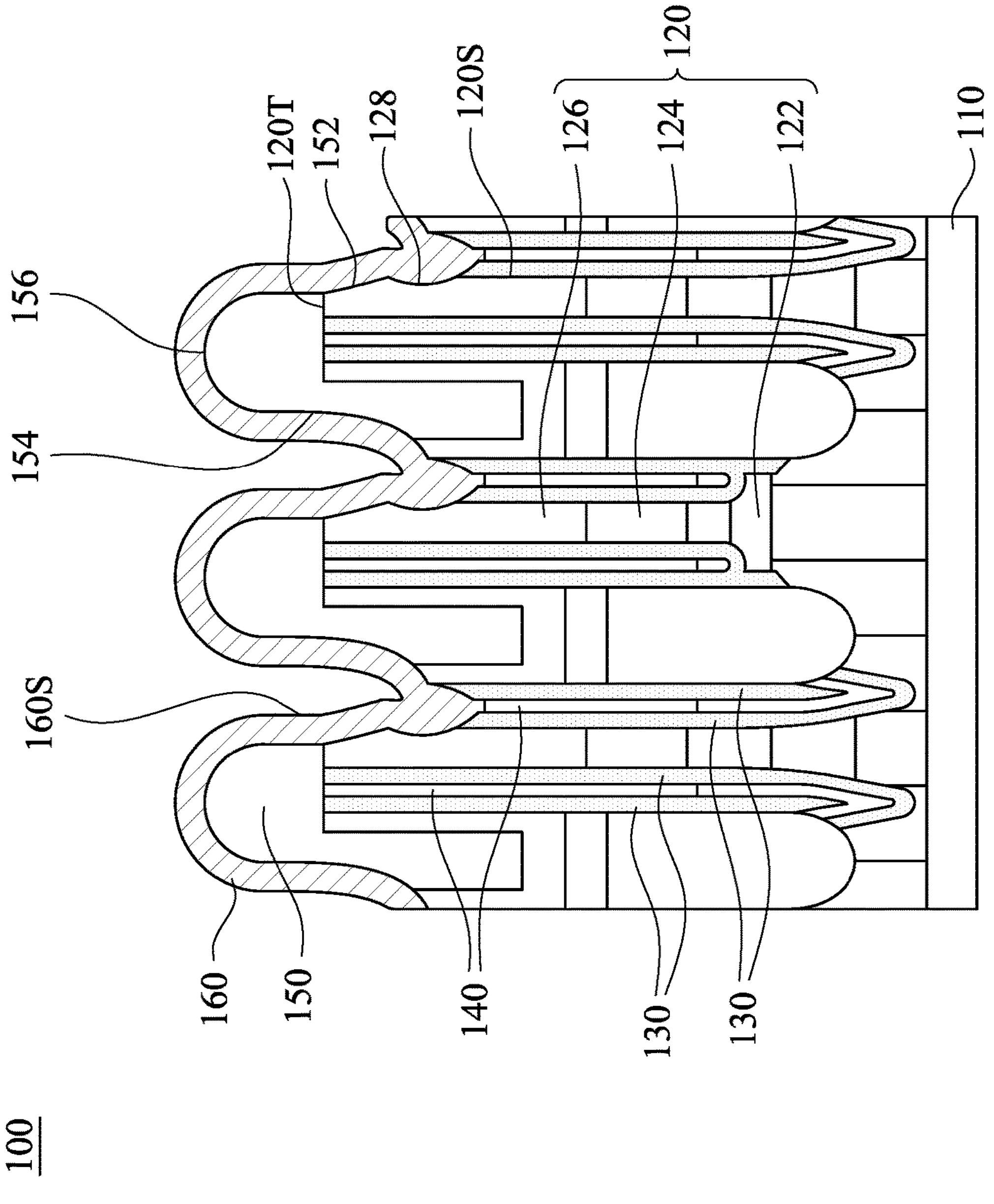

Reference is made to FIG. 1 and FIG. 3. In step S2, a silicon nitride layer 160 is formed to seal the air gaps 140. Specifically, the silicon nitride layer is a fluorine-resistant etch stop coating (FRESCO) silicon nitride layer. A method is used to form fluorine-resistant etch stop coating silicon nitride and improve the thickness conformity, which will be described in detail in the following paragraphs. The silicon nitride layer 160 contacts the first surface 152, the second surface 154, and the top surface 156 of the landing pads 150 and the recessed surfaces 128 of the bit line structures 120. The silicon nitride layer 160 is substantially conformal to the profile of the landing pads 150 and the recessed surface 128 of the bit line structures 120. Accordingly, the silicon nitride layer 160 includes a recessed surface 160S above the recessed surface 128 of the bit line structures 120.

Figure 4:
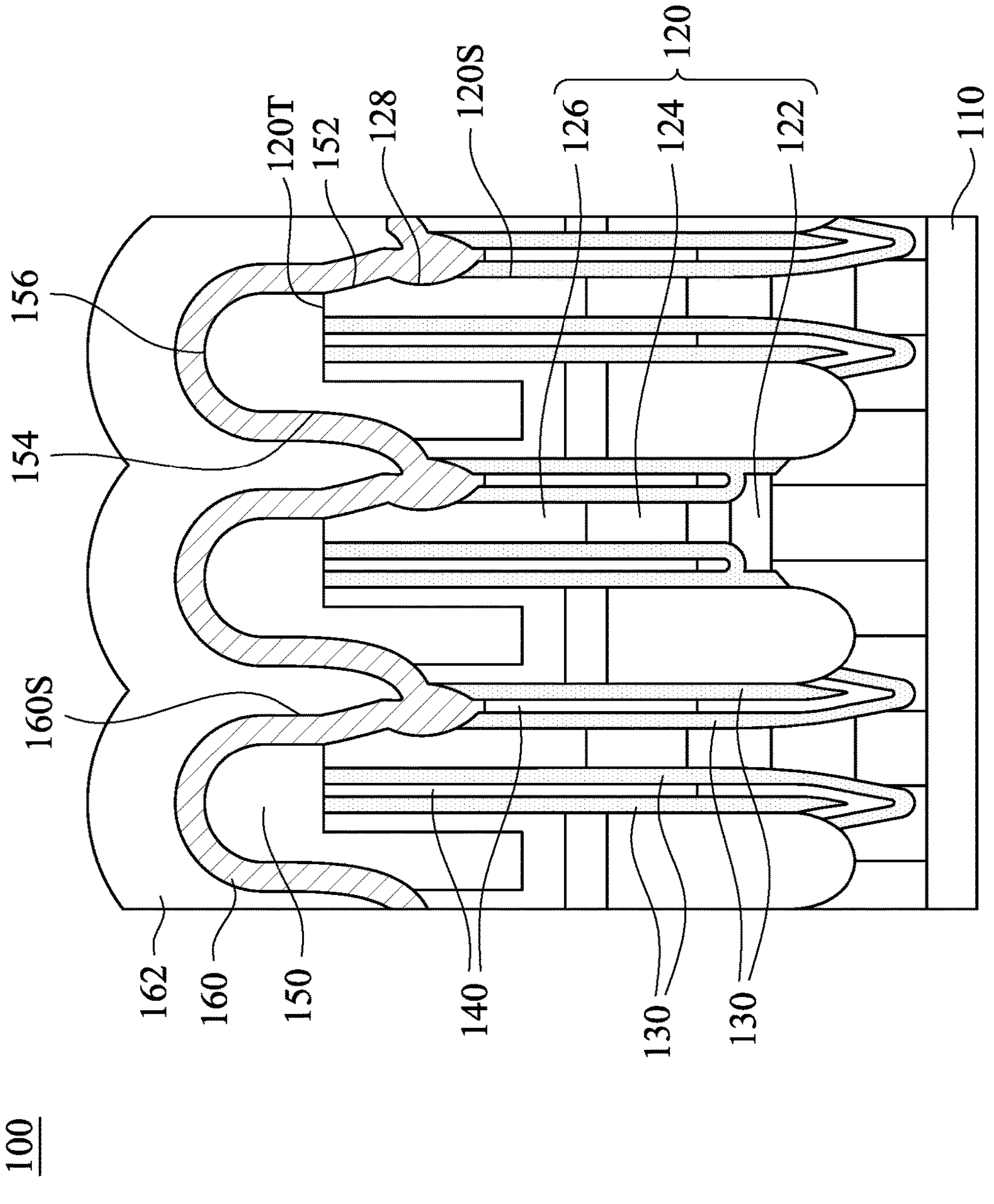

Reference is made to FIG. 1 and FIG. 4. In step S3, a first nitride layer 162 is formed on the silicon nitride layer 160. The first nitride layer 162 is a cap layer formed by Atomic Layer Deposition (ALD). The silicon nitride layer 160 and the first nitride layer 162 are both formed to protect the air gaps 140.

Figure 5:
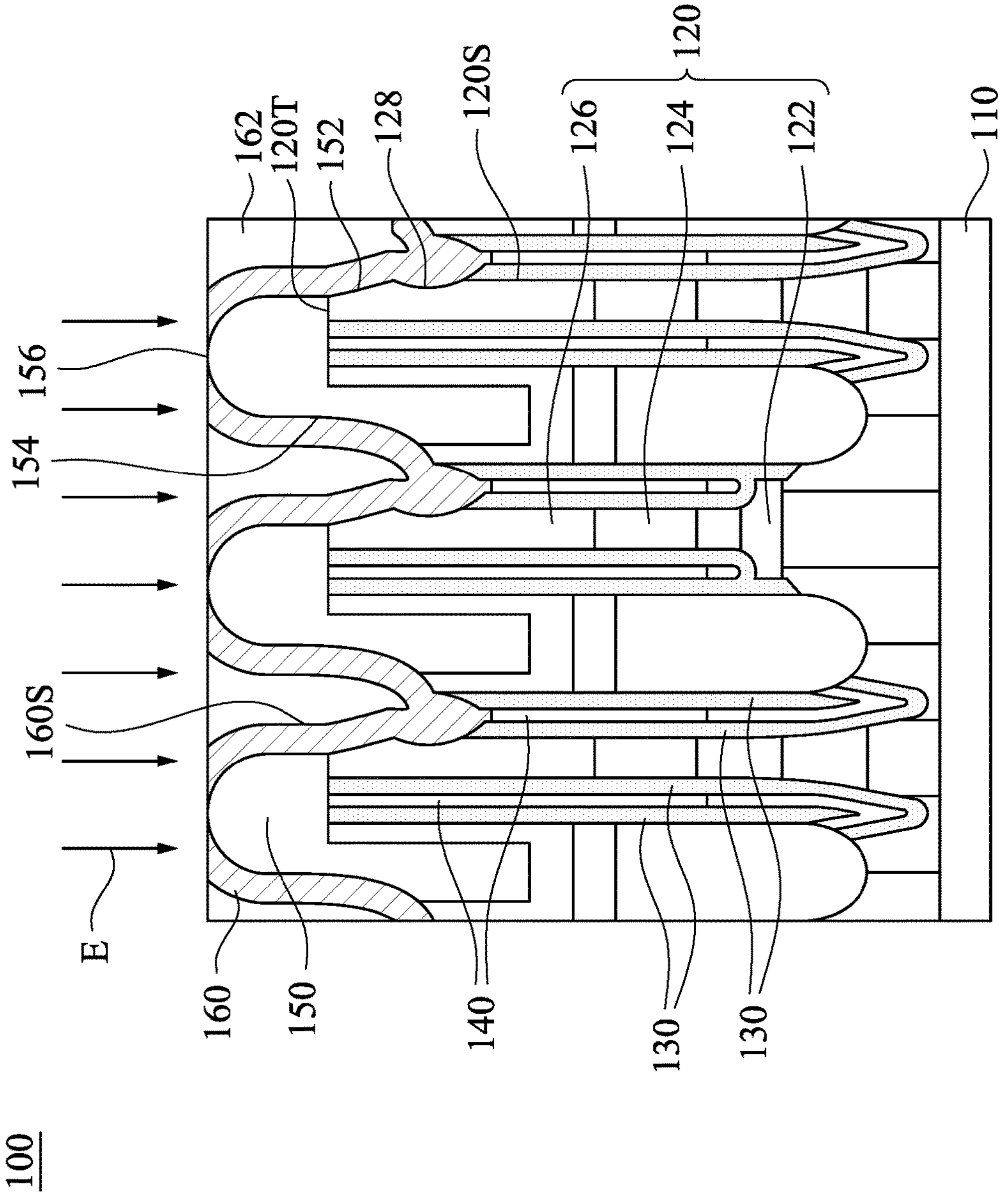

Reference is made to FIG. 1 and FIG. 5. In step S4, a portion of the silicon nitride layer 160 and a portion of the first nitride layer 162 are removed though dry etch E. The top surface 156 of the landing pads 150 is exposed from the silicon nitride layer 160.

Figure 6:
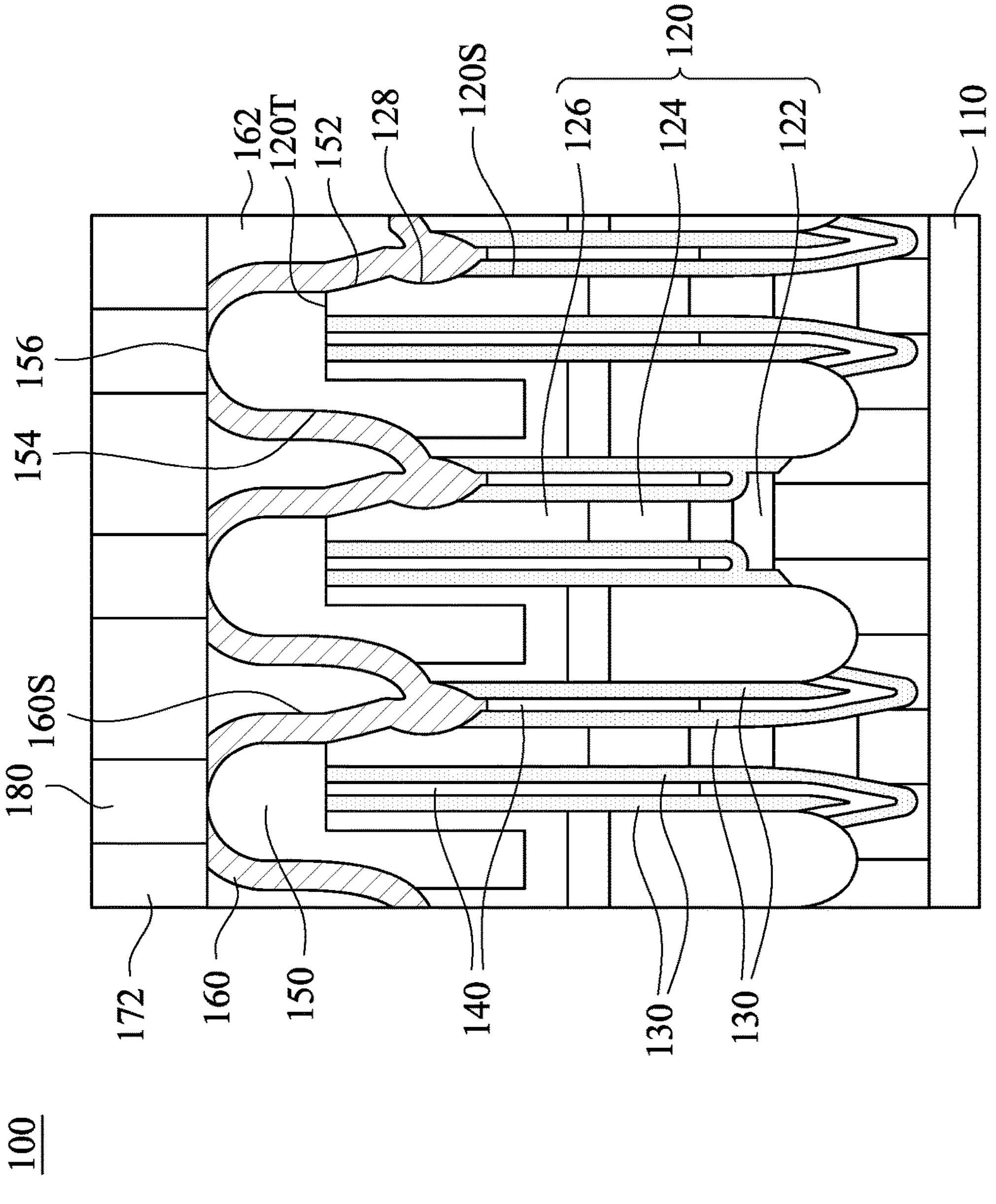

Reference is made to FIG. 1 and FIG. 6. In step S5, a second nitride layer 170 is further formed above the landing pads 150, the silicon nitride layer 160, and the first nitride layer 162. In the subsequent process, cell contacts 180 are formed in the second nitride layer 170 to contact the landing pads 150.

Figure 7:
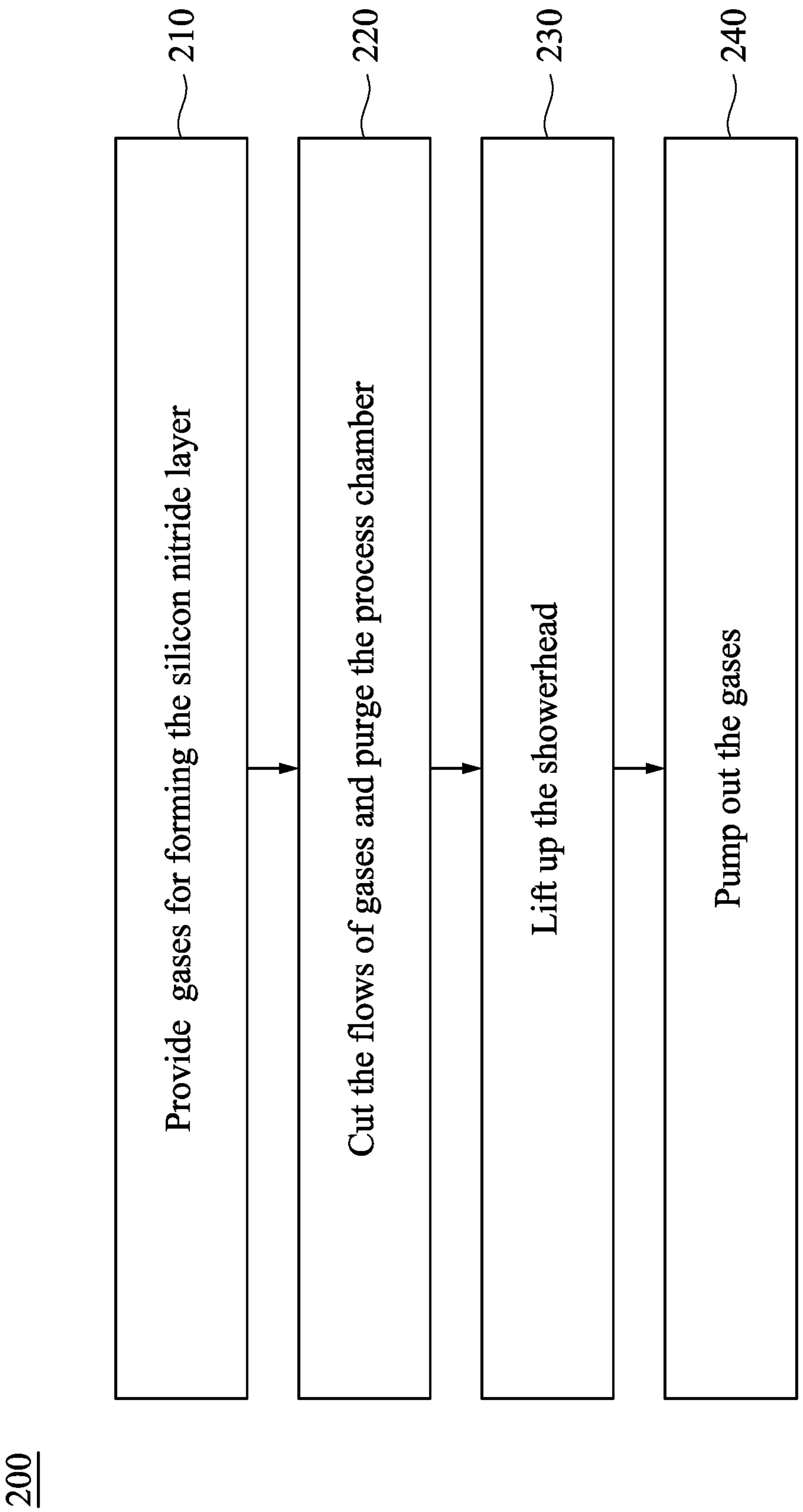
FIG. 7 is a flow chart of the method 200 of forming the silicon nitride layer.
Figure 8:
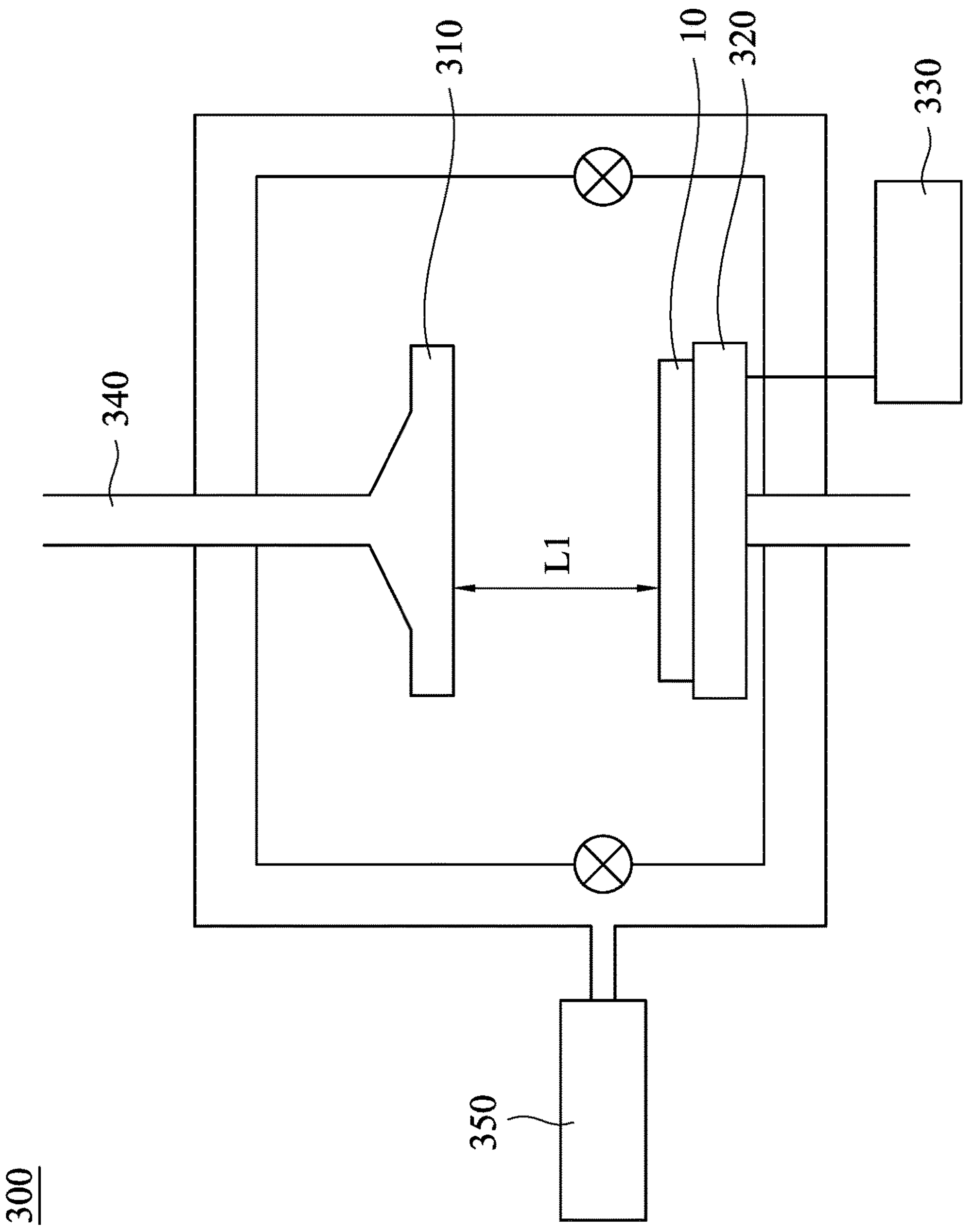
FIG. 8 is a schematic of a process chamber in which the semiconductor device is disposed.

FIG. 7 is a flow chart of the method 200 of forming the silicon nitride layer 160. FIG. 8 is a schematic of a process chamber 300 in which the semiconductor device 100 is disposed. The semiconductor device 100 shown in FIGS. 2-6 is denoted by a wafer 10 in FIG. 8. The process chamber 300 includes a showerhead 310 and a carrier 320. The wafer 10 is disposed on the carrier 320. The process chamber 300 is connected to a heater 330. The showerhead 310 is connected to a gas tube 340, and the gases used to form the silicon nitride layer 160 is provided through the gas tube 340. The gas tube 340 is connected to a gas delivery system (not shown), which includes multiple gas sources depending on the process to be operated. For example, precursor gas, reaction gas, purge gas, etc., are introduced into the process chamber 300 through the gas tube 340. The process chamber 300 is connected to a pump 350.

Reference is made to FIG. 7 and FIG. 8. In step 210, gases for forming the silicon nitride layer is provided. For example, the gases used to form the silicon nitride layer 160 in this step includes precursor gas, reaction gas, and purge gas such as silane ($SiH_4$), ammonia ($NH_3$), trimethoxysilane (TMS), Helium, and Nitrogen. The gases are provided from the showerhead 310 into the process chamber 300. Deposition of the silicon nitride layer starts after the flow of gases is stable. The silicon nitride layer 160 is deposited on the landing pads 150, the bit line structures 120 and the cavities in the spacers 130. As shown in FIG. 3, the air gaps 140 are sealed. It is noted that one or more steps may be included in step 210 based on practical applications.

In step 210, there is a first distance L1 between the showerhead 310 and the wafer 10. In some embodiment, the first distance L1 is in a range from about 0.25 to 0.6 inches. In step 210, the carrier 320 having the wafer 10 thereon is heated to 500 degrees. The pressure in the process chamber 300 is maintained in 4.5 torr to 5 torr. In a preferred embodiment, the pressure in the process chamber 300 is maintained at about 4.6 torr, which is beneficial for the film uniformity in the deposition process.

In step 210, a ratio between helium and nitrogen is 1:6. For example, the gas flow of helium is about 3000 sccm, and the gas flow of $N_2$ is about 18000 sccm. As such, the heat transmission efficiency is improved compared to a helium free condition.

Reference is made to FIG. 7 and FIG. 8. In step 220, cut the flows of gases and purge the process chamber after the fluorine-resistant etch stop coating silicon nitride layer is deposited. Specifically, supply of one or more of the gases $SiH_4$, $NH_3$, and TMS is stopped gradually or simultaneously. In this step, the temperature of the process chamber 300 is remained the same. The pressure in the process chamber 300 is reduced to about 2.5 torr. The ratio between helium and nitrogen, and the first distance L1 are the same as those in step 210. The first distance L1 are the same as in step 210.

Figure 9:
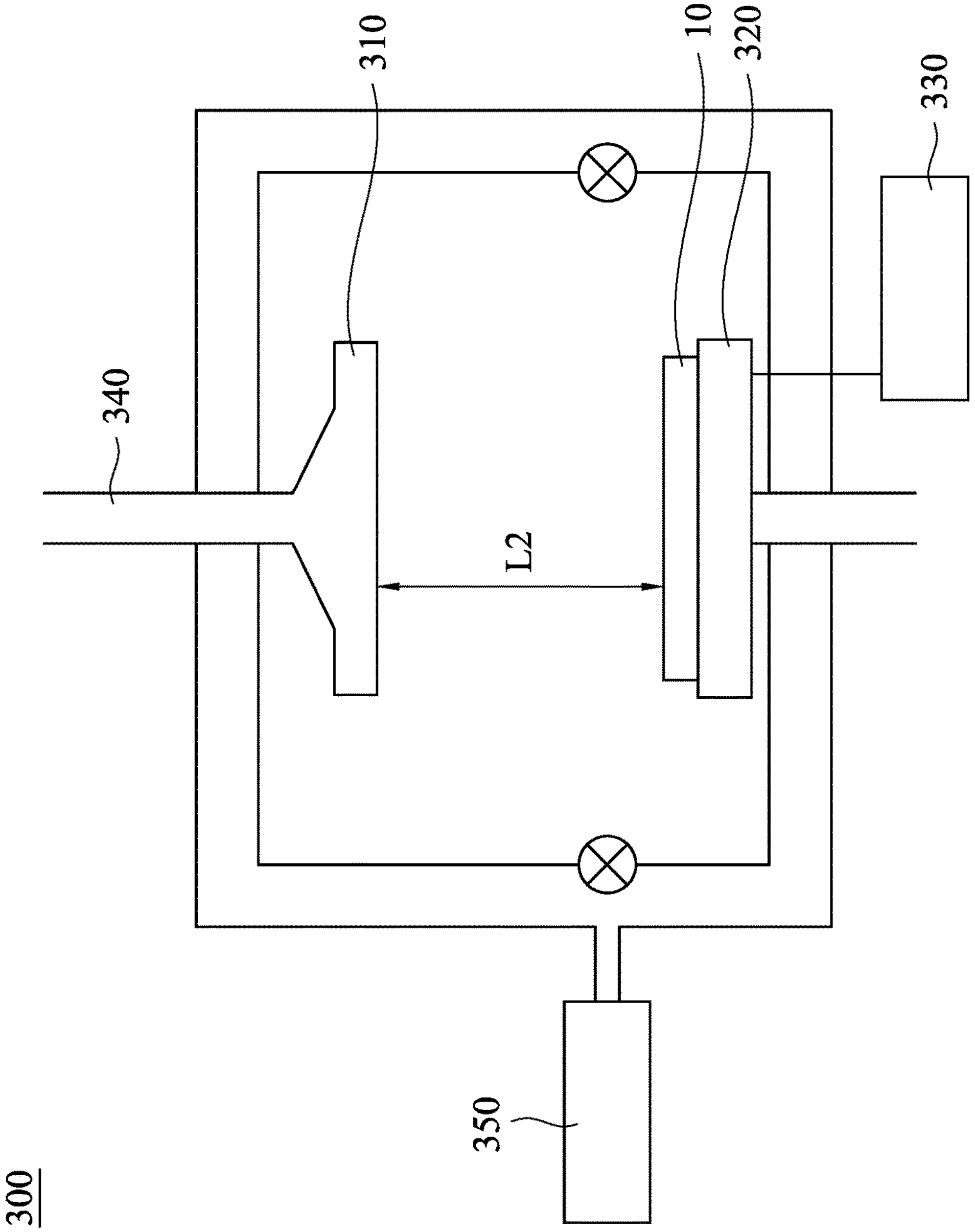
FIG. 9 is another schematic of a process chamber in which the semiconductor device is disposed.

FIG. 9 is another schematic of a process chamber 300 in which the semiconductor device 100 is disposed. Reference is made to FIG. 7 and FIG. 9. In step 230, the showerhead 310 is lifted up. The first distance L1 is increased to a second distance L2 as shown in FIG. 9. In some embodiments, the second distance L2 is about 1.7 to 2.1 inches. In a preferred embodiment, the distance L2 is 1.9 inches.

In step 230, conformity of the deposition process can be improved by increasing the distance between the showerhead 310 and the carrier 320. In this step, the pressure in the process chamber 300 is maintained at about 2.5 torr. As such, the first nitride layer 162 formed in step S3 (see FIG. 4) won't fill in to the air gaps 140 through the silicon nitride layer 160. For example, if the conformity of the silicon nitride layer 160 is poor, the thickness and profile of those materials protecting the air gaps is not stable from an edge to a center of a wafer. As a result, the first nitride layer 162 may fill into the air gaps 140 from the positions of the recessed surface 160S of the silicon nitride layer 160 and the recessed surface 128 of the bit line structures 120.

Similarly, the second nitride layer 170 formed in step S5 (see FIG. 6) won't fill in to the air gaps 140 through the silicon nitride layer 160 and the first nitride layer 162. For example, if the conformity of the silicon nitride layer 160 is poor, the thickness and profile of those materials protecting the air gaps is not stable from an edge to a center of a wafer. As a result, the second nitride layer 170 may fill into the air gaps 140 from the positions of the remained first nitride layer 162, the recessed surface 160S of the silicon nitride layer 160, and the recessed surface 128 of the bit line structures 120.

Therefore, the method of forming the silicon nitride layer 160 can prevent abnormal profile between the cell contacts 180 and the landing pads 150. Accordingly, the electrical performance of the wafer can be improved.

In step 240, gases in the process chamber 300 is pumped out. The pressure in the process chamber 300 is reduced until the process chamber 300 is in vacuum.

According to the method 200 described above, the conformity of the silicon nitride layer 160 is improved. For example, in some embodiments, the thickness of a silicon nitride formed by convention method is 150.2 angstroms, and a deviation range of the thickness is about 5.61 angstroms. Therefore, a thickness conformity value is about 1.87% derived from (range/2)/thickness. The thickness of a silicon nitride layer 160 formed by the method 200 is about 146.0 angstroms, and a deviation range of the thickness is about 4.45 angstroms. Therefore, a thickness conformity value is reduced to about 1.52%, which means that the thickness conformity of the silicon nitride layer 160 is improved. Accordingly, the method of the present disclosure can prevent wafer acceptance test failure.

In summary, the method of forming the silicon nitride layer to seal the air gaps of the present disclosure can improve thickness conformity. As such, the nitride layer formed above the silicon nitride layer won't fill into the air gaps. Therefore, the method can prevent abnormal profile between the cell contacts 180 and the landing pads 150 and prevent wafer acceptance test failure.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A method of manufacturing a semiconductor device, comprising:

providing a bit line structure on a substrate, wherein the bit line structure is located between a pair of spacers containing air gaps; and depositing a silicon nitride film to seal the air gaps, comprising:

providing gases from a showerhead into a process chamber, wherein the showerhead and a wafer on a carrier have a first distance therebetween;

purging the process chamber; and lifting up the showerhead such that the first distance is increased to a second distance greater than the first distance.

2. The method of manufacturing the semiconductor device of claim 1, wherein a pressure in the process chamber is in a range from 4.5 torr to 5 torr before the step of purging the process chamber.

3. The method of manufacturing the semiconductor device of claim 2, wherein the pressure in the process chamber is reduced to smaller than the 4.5 torr in the step of lifting up the showerhead.

4. The method of manufacturing the semiconductor device of claim 1, wherein the gases comprise helium and nitrogen, and a ratio between helium and nitrogen is 1:6.

5. The method of manufacturing the semiconductor device of claim 1, wherein the step of depositing the silicon nitride film to seal the air gaps further comprises pumping the gases out of the process chamber after lifting up the showerhead.

6. The method of manufacturing the semiconductor device of claim 1, wherein the step of lifting up the showerhead is performed when the gases comprises helium and nitride.

7. The method of manufacturing the semiconductor device of claim 1, further comprising:

depositing a first nitride layer on the silicon nitride film.

8. The method of manufacturing the semiconductor device of claim 7, further comprising:

removing a portion of the silicon nitride film and a portion of the first nitride layer to expose a landing pad disposed over the bit line structure.

9. The method of manufacturing the semiconductor device of claim 8, further comprising:

forming a cell contact in a second nitride layer above the landing pad.

10. A method of manufacturing a semiconductor device, comprising:

providing a bit line structure on a substrate, wherein the bit line structure is located between a pair of spacers containing air gaps; and depositing a silicon nitride film to seal the air gaps, comprising:

providing gases from a showerhead into a process chamber, wherein the showerhead and a wafer on a carrier have a first distance therebetween;

purging the process chamber; and increasing the first distance between the showerhead and the wafer to a second distance greater than the first distance.

11. The method of manufacturing the semiconductor device of claim 10, wherein the step of increasing the first distance is performed by lifting up the showerhead away from the carrier.

12. The method of manufacturing the semiconductor device of claim 10, wherein a pressure in the process chamber is in a range from 4.5 torr to 5 torr before the step of purging the process chamber.

13. The method of manufacturing the semiconductor device of claim 12, wherein the pressure in the process chamber is reduced to smaller than the 4.5 torr in the step of increasing the first distance between the showerhead and the wafer.

14. The method of manufacturing the semiconductor device of claim 10, wherein the gases comprise helium and nitrogen, and a ratio between helium and nitrogen is 1:6.

15. The method of manufacturing the semiconductor device of claim 10, wherein the step of depositing the silicon nitride film to seal the air gaps further comprises pumping the gases out of the process chamber after increasing the first distance between the showerhead and the wafer.

16. The method of manufacturing the semiconductor device of claim 10, wherein the step of increasing the first distance between the showerhead and the wafer is performed when the gases comprise helium and nitride.

* * * * *